(12) United States Patent
Kobrin et al.

(10) Patent No.: US 9,481,112 B2
(45) Date of Patent: Nov. 1, 2016

(54) CYLINDRICAL MASTER MOLD ASSEMBLY FOR CASTING CYLINDRICAL MASKS

(71) Applicant: METAMATERIAL TECHNOLOGIES USA, INC., Pleasanton, CA (US)

(72) Inventors: Boris Kobrin, Pleasanton, CA (US); Ian McMackin, Pleasanton, CA (US)

(73) Assignee: METAMATERIAL TECHNOLOGIES USA, INC., Pleasanton, CA (US)

( * ) Notice: Subject to any disclaimer, the term of this patent is extended or adjusted under 35 U.S.C. 154(b) by 233 days.

(21) Appl. No.: 13/756,370

(22) Filed: Jan. 31, 2013

(65) Prior Publication Data

US 2014/0212536 A1    Jul. 31, 2014

(51) Int. Cl.
*B29C 33/44*    (2006.01)
*B29C 39/02*    (2006.01)
*B29C 43/46*    (2006.01)
(Continued)

(52) U.S. Cl.
CPC ........... *B29C 33/448* (2013.01); *B29C 33/424* (2013.01); *B29C 39/026* (2013.01); *B29C 39/36* (2013.01); *B29C 43/46* (2013.01);
(Continued)

(58) Field of Classification Search
CPC ..... B29C 33/50; B29C 33/52; B29C 33/505; B29C 33/448; B29C 33/424
USPC ................................ 264/221, 317
See application file for complete search history.

(56) References Cited

U.S. PATENT DOCUMENTS 3,320,344 A     5/1967   Slipp
3,515,798 A *   6/1970   Sievert .................... F16B 4/004
                                                          138/122
(Continued)

FOREIGN PATENT DOCUMENTS

CN        100398304        7/2008
RU        2157763 C2       10/2000
(Continued)

OTHER PUBLICATIONS

International Search Report and Written Opinion of the International Searching Authority for Application No. PCT/US2013/038675 dated Aug. 29, 2013.
(Continued)

*Primary Examiner* — Alison L Hindenlang
*Assistant Examiner* — Emmanuel S Luk
(74) *Attorney, Agent, or Firm* — Joshua D. Isenberg; JDI Patent

(57) ABSTRACT

Aspects of the present disclosure include a cylindrical master mold assembly having a cylindrical patterned component with a first diameter and a sacrificial casting component with a second diameter. The component with the smaller radius may be co-axially inserted into the interior of the component with the larger radius. Patterned features may be formed on the interior surface of the cylindrical patterned component that faces the sacrificial casting component. The sacrificial casting component may be removed once a cast polymer has been cured to allow the polymer to be released. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

7 Claims, 5 Drawing Sheets

(51) Int. Cl.
    *B29C 33/50*    (2006.01)
    *B29C 39/36*    (2006.01)
    *B29C 33/42*    (2006.01)
    *G03F 7/00*     (2006.01)
    *G03F 7/24*     (2006.01)

(52) U.S. Cl.
    CPC .......... *G03F 7/0002* (2013.01); *B29C 33/505* (2013.01); *G03F 7/24* (2013.01)

(56) References Cited

U.S. PATENT DOCUMENTS

| | | | | |
|---|---|---|---|---|
| 3,520,509 | A * | 7/1970 | Carey | 249/61 |
| 3,619,446 | A * | 11/1971 | Nauta | B29C 33/405 |
| | | | | 101/28 |
| 3,622,117 | A * | 11/1971 | Lerman | B29C 33/0033 |
| | | | | 249/112 |
| 4,035,534 | A * | 7/1977 | Nyberg | B29C 61/065 |
| | | | | 138/137 |
| 4,070,749 | A * | 1/1978 | Misono | G02F 1/1339 |
| | | | | 228/124.1 |
| 4,179,320 | A * | 12/1979 | Midgley | H02G 15/18 |
| | | | | 138/103 |
| 4,338,970 | A * | 7/1982 | Krackeler | H02G 1/16 |
| | | | | 138/103 |
| 4,919,608 | A * | 4/1990 | Catalanotti et al. | 425/556 |
| 5,406,871 | A * | 4/1995 | Lambert, Jr. | B29C 61/065 |
| | | | | 138/103 |
| 5,746,253 | A * | 5/1998 | Dust | B29C 45/0046 |
| | | | | 138/137 |
| 5,888,701 | A * | 3/1999 | Fan | 430/306 |
| 6,675,863 | B1 * | 1/2004 | Wang et al. | 164/46 |
| 7,700,199 | B2 | 4/2010 | Wang et al. | |
| 8,182,982 | B2 | 5/2012 | Kobrin | |
| 8,192,920 | B2 | 6/2012 | Kobrin | |
| 8,318,386 | B2 | 11/2012 | Kobrin | |
| 8,334,217 | B2 | 12/2012 | Kobrin | |
| 8,425,789 | B2 | 4/2013 | Kobrin | |
| 8,518,633 | B2 | 8/2013 | Kobrin et al. | |
| 2005/0015046 | A1 * | 1/2005 | Weber et al. | 604/96.01 |
| 2005/0067286 | A1 | 3/2005 | Ahn et al. | |
| 2007/0264481 | A1 | 11/2007 | DeSimone et al. | |
| 2009/0087599 | A1 * | 4/2009 | Cheng et al. | 428/34.1 |
| 2009/0220789 | A1 | 9/2009 | DeSimone et al. | |
| 2009/0269705 | A1 | 10/2009 | Kobrin | |
| 2010/0123885 | A1 | 5/2010 | Kobrin | |
| 2010/0294421 | A1 * | 11/2010 | Fujiki | B29C 33/505 |
| | | | | 156/156 |
| 2011/0182805 | A1 | 7/2011 | DeSimone et al. | |
| 2011/0210480 | A1 | 9/2011 | Kobrin | |
| 2012/0274004 | A1 | 11/2012 | Kobrin | |
| 2012/0282554 | A1 | 11/2012 | Kobrin et al. | |
| 2013/0224636 | A1 | 8/2013 | Kobrin | |
| 2013/0280894 | A1 | 10/2013 | Lee et al. | |

FOREIGN PATENT DOCUMENTS

| | | |
|---|---|---|
| WO | 2009094009 A | 7/2009 |
| WO | 2012027050 A | 3/2012 |

OTHER PUBLICATIONS

U.S. Appl. No. 13/756,348 entitled "Cylindrical Master Mold and Method of Fabrication", to Boris Kobrin, filed Jan. 31, 2013.
Non-Final Office Action for U.S. Appl. No. 13/756,348, dated Nov. 6, 2015.
Final Office Action for U.S. Appl. No. 13/756,348, dated May 19, 2016.
Non-Final Office Action for U.S. Appl. No. 14/521,375, dated May 3, 2016.
Chinese Office Action for CN Application No. 20130035462.0, dated Feb. 1, 2016.

* cited by examiner

CYLINDRICAL MASTER MOLD ASSEMBLY FOR CASTING CYLINDRICAL MASKS

FIELD OF THE DISCLOSURE

Aspects of the present disclosure relate to a master mold assembly and methods for using the master mold assembly to manufacture cylindrical lithography masks.

BACKGROUND

This section describes background subject matter related to the disclosed embodiments of the present invention. There is no intention, either express or implied, that the background art discussed in this section legally constitutes prior art.

Nanostructuring is necessary for many present applications and industries and for new technologies and future advanced products. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-field phase shift lithography, and plasmonic lithography, for example.

Cylindrical masks (molds) have been used for nanoimprint Roll-to-Roll lithography before. Some cylindrical masks have used nanoporous aluminum cylinders directly as molds for nanoimprint lithography (thermal imprint-embossing). In other implementations, transparent nanostructured cylinders have been used as molds for UV-curing nanoimprint processes. Such masks were fabricated using casting PDMS materials from nanopatterned masters made by e-beam writing process, and then laminating such flexible sort nanopatterned submaster over transparent cylinder.

Earlier authors have suggested a method of nanopatterning large areas of rigid and flexible substrate materials based on near-field optical lithography described in Patent applications WO2009094009 and U.S. Pat. No. 8,182,982, where a rotatable mask is used to image a radiation-sensitive material, and which are both incorporated herein in their entirety. Typically the rotatable mask comprises a cylinder or cone. The nanopatterning technique makes use of Near-Field photolithography, where the mask used to pattern the substrate is in contact with the substrate. Near-Field photolithography may make use of an elastomeric phase-shifting mask, or may employ surface plasmon technology, where a rotating cylinder surface comprises metal nanoholes or nanoparticles. Near-field phase shift lithography involves exposure of a radiation-sensitive material layer to ultraviolet (UV) light that passes through an elastomeric phase mask while the mask is in conformal contact with a radiation-sensitive material. Bringing an elastomeric phase mask into contact with a thin layer of radiation-sensitive material causes the radiation-sensitive material to "wet" the surface of the contact surface of the mask. Passing UV light through the mask while it is in contact with the radiation-sensitive material exposes the radiation-sensitive material to the distribution of light intensity that develops at the surface of the mask. A phase mask is formed with a depth of relief that is designed to modulate the phase of the transmitted light by $\pi$ radians. As a result of the phase modulation, a local null in the intensity appears at step edges in the relief pattern formed on the mask. When a positive radiation-sensitive material is used, exposure through such a mask, followed by development, yields a line of radiation-sensitive material with a width equal to the characteristic width of the null in intensity. For 365 nm (Near UV) light in combination with a conventional radiation-sensitive material, the width of the null in intensity is approximately 100 nm. A PDMS mask can be used to form a conformal, atomic scale contact with a layer of radiation-sensitive material. This contact is established spontaneously upon contact, without applied pressure. Generalized adhesion forces guide this process and provide a simple and convenient method of aligning the mask in angle and position in the direction normal to the radiation-sensitive material surface, to establish perfect contact. There is no physical gap with respect to the radiation-sensitive material. Some elastomeric materials, for example, PDMS are transparent to UV light with wavelengths greater than 300 nm. Passing light from a mercury lamp (where the main spectral lines are at 355-365 nm) through the PDMS while it is in conformal contact with a layer of radiation-sensitive material exposes the radiation-sensitive material to the intensity distribution that forms at the mask.

Another implementation of the mask may include surface plasmon technology in which a metal layer or film is laminated or deposited onto the outer surface of the rotatable mask. The metal layer or film has a specific series of through nanoholes. In another embodiment of surface plasmon technology, a layer of metal nanoparticles is deposited on the transparent rotatable mask's outer surface, to achieve the surface plasmons by enhanced nanopatterning.

The above mentioned applications may each utilize a rotatable mask. The rotatable masks may be manufactured with the aid of a master mold assembly (fabricated using one of known nano lithography techniques, like e-beam, Deep UV, Interference and Nanoimprint lithographies). The rotatable masks may be made by molding a polymer material, curing the polymer to form a replica film, and finally laminating the replica film onto the surface of a cylinder. Unfortunately, this method unavoidably would create some "macro" stitching lines between pieces of polymer film (even if the master is very big and only one piece of polymer film is required to cover entire cylinder's surface one stitching line is still unavoidable).

It is within this context that aspects of the present disclosure arise.

SUMMARY

Aspects of the present disclosure describe various patterned component assemblies and methods for fabricating near-field optical lithography masks for "Rolling mask" lithography with the patterned component assemblies. In rolling mask lithography, a cylindrical mask is coated with a polymer, which is patterned with desired features in order to obtain a mask for phase-shift lithography or plasmonic printing. The features that are patterned into the polymer may be patterned through the use of the patterned component assemblies described in the present application. The pattern component may include patterned features that range in size from about 1 nanometer to about 100 microns, preferably from about 10 nanometers to about 1 micron, more preferably from about 50 nanometers to about 500 nanometers. The cylindrical mask may be used to print features ranging in size from about 1 nanometer to about 1000 nanometers, preferably about 10 nanometers to about 500 nanometers, more preferably about 50 nanometers to about 200 nanometer A first aspect of the present disclosure describes a cylindrical master mold assembly comprised of a cylindrical patterned component that has a first diameter and a sacrificial casting component that has a second diameter. The second diameter may be smaller than the first diameter. Patterned features may be formed on the interior surface of the cylindrical patterned component and the sacrificial casting component may be inserted co-axially into the interior of the cylindrical patterned component. A polymer material may then fill the gap between the patterned component and the sacrificial casting component in order to form the cylindrical mask. The sacrificial casting component may be removed once the polymer has been cured. According to certain aspects of the present disclosure, the sacrificial casting component may be fractured in order to allow the cylindrical mask to be removed. Additionally, certain aspects of the present disclosure also provide for the sacrificial casting component to be deformed in order to allow the cylindrical mask to be removed.

According to an additional aspect of the present disclosure a cylindrical master mold assembly may have a cylindrical patterned component that has a first diameter, and a sacrificial casting component that has a second diameter. The second diameter may be larger than the first diameter. The patterned component may have patterned features formed on its exterior surface. The patterned component may be inserted co-axially into the sacrificial casting component. A polymer may then fill the gap between the patterned component and the sacrificial casting component. Once the polymer has cured, the sacrificial casting component may be broken away, leaving the cylindrical mask on the patterned component. The cylindrical mask may then be peeled off of the patterned component.

According to a further aspect, a cylindrical mask may comprise a cylindrical elastomer component with an inner radius and a rigid transparent cylindrical component having an outer radius. A gas retainer is configured to retain a volume of gas between an inner surface of the elastomer component and an outer surface of the rigid transparent cylindrical component. The elastomer component has a major surface with a nanopattern formed in the major surface. The outer radius of the rigid transparent component is sized to fit within the cylindrical elastomer component.

In some implementations, the gas retainer may include two seals. Each seal seals a corresponding end of the volume of gas. Such seals may be in the form of O-rings or gaskets.

In some implementations, the volume of gas may be retained by a bladder disposed between the major surface of the elastomer component and the major surface of the rigid transparent cylindrical component.

In some implementations, the major surface of the cylindrical elastomeric component on which the nanopattern is formed is an outer cylindrical surface.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "above", "below", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
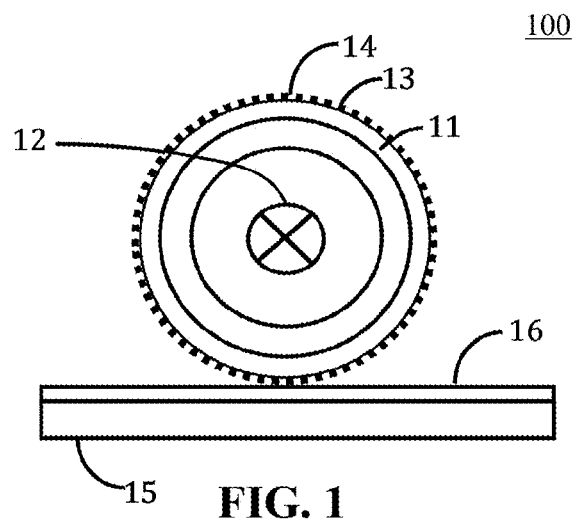
FIG. 1 is a schematic diagram illustrating "Rolling mask" near-field nano lithography.

The authors have described a "Rolling mask" near-field nanolithography system earlier in International Patent Application Publication Number WO2009094009, which is incorporated herein by reference. One of the embodiments is show in FIG. 1. The "rolling mask" consists of a glass (e.g., fused silica) frame in the shape of hollow cylinder 11, which contains a light source 12. An elastomeric cylindrical rolling mask 13 laminated on the outer surface of the cylinder 11 has a nanopattern 14 fabricated in accordance with the desired pattern. The rolling mask 13 is brought into a contact with a substrate 15 coated with radiation-sensitive material 16.

A nanopattern 14 can be designed to implement phase-shift exposure, and in such case is fabricated as an array of nanogrooves, posts or columns, or may contain features of arbitrary shape. Alternatively, nanopattern can be fabricated as an array or pattern of nanometallic islands for plasmonic printing. The nanopattern on the rolling mask can have features ranging in size from about 1 nanometer to about 100 microns, preferably from about 10 nanometers to about 1 micron, more preferably from about 50 nanometers to about 500 nanometers. The rolling mask can be used to print features ranging in size from about 1 nanometer to about 1000 nanometers, preferably about 10 nanometers to about 500 nanometers, more preferably about 50 nanometers to about 200 nanometers.

The nanopattern 14 on the rolling mask 13 may be manufactured with the use of a cylindrical master mold assembly. Aspects of the present disclosure describe the cylindrical master mold assembly and methods for forming the nanopattern on the rolling mask 13.

Figures 2A, 2B:
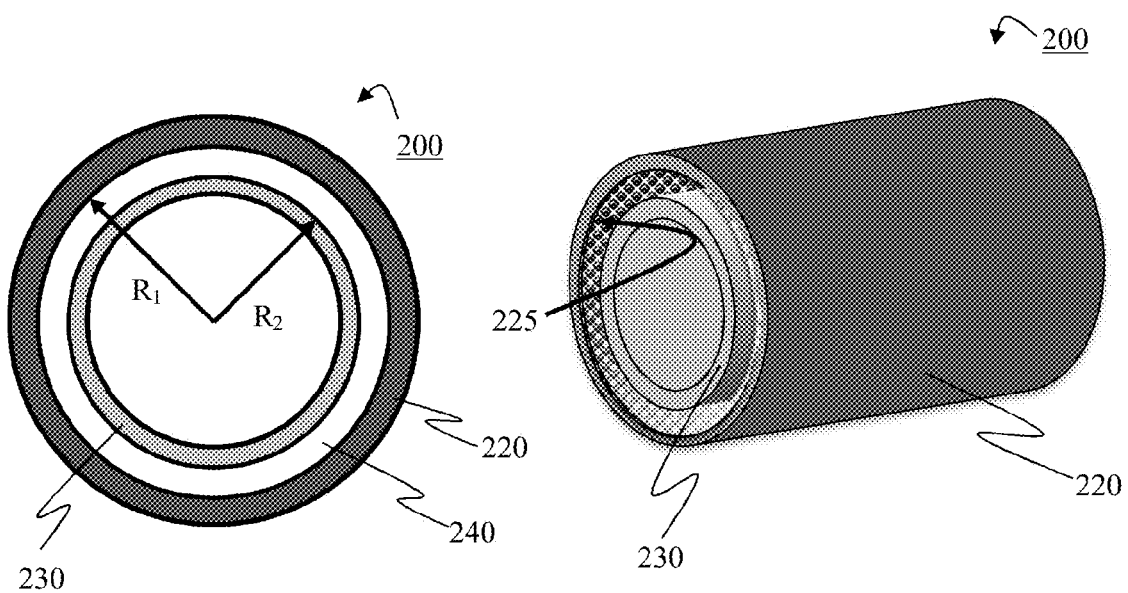
FIG. 2A is an overhead view of a cylindrical master mold assembly comprising a cylindrical patterned component with a sacrificial casting component co-axially inserted inside according to an aspect of the present disclosure.
FIG. 2B is a perspective view of a cylindrical master mold assembly shown in FIG. 2A.
Figure 3:
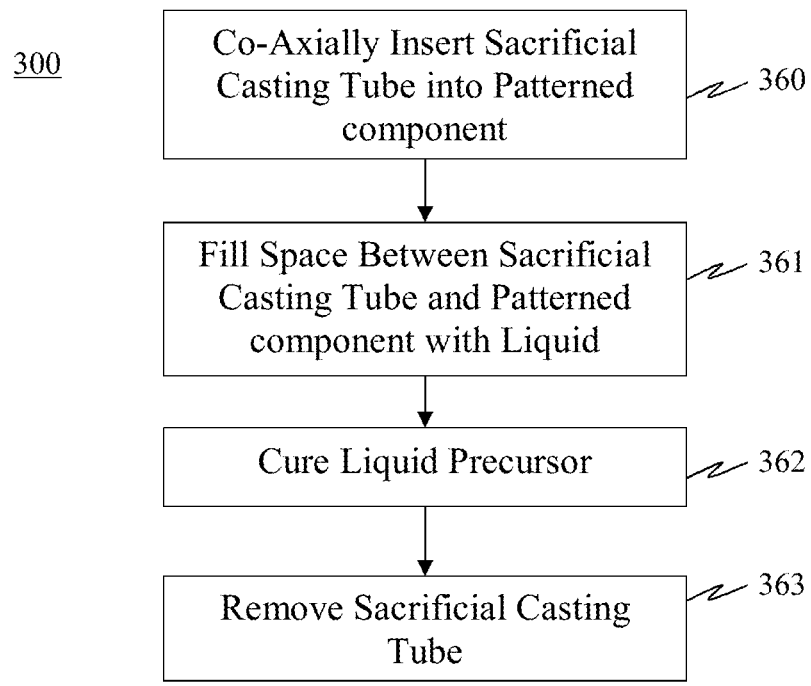
FIG. 3 is a block diagram of instructions that describe a method for forming a cylindrical mask with cylindrical master mold assembly according to aspects of the present disclosure.

FIG. 2A is an overhead view of a master mold assembly 200. The master mold assembly 200 comprises a cylindrical patterned component 220 and sacrificial casting component 230. The cylindrical patterned component 220 may have a first radius $R_1$ and the sacrificial casting component 230 may have a second radius $R_2$. According to a first aspect of the present disclosure, $R_1$ may be greater than $R_2$ in order to allow for the sacrificial casting component 230 to be co-axially inserted into the interior of the cylindrical patterned component 220 with a space 240 between them.

The patterned component 220 may be made from a material that is transparent to optical radiation, such as infrared, visible, and/or ultraviolet wavelengths. By way of example, and not by way of limitation, the cylinder may be a glass such as fused silica. It is noted that fused silica is commonly referred to as "quartz" by those in the semiconductor fabrication industry. Although quartz is common parlance, "fused silica" is a better term. Technically, quartz is crystalline and fused silica is amorphous. As may be seen in FIG. 2B, the interior surface of the patterned component 220 may be patterned with the desired pattern 225 that will be used to form the nanopattern 14 on the cylindrical mask 13. By way of example, and not by way of limitation, the pattern 225 may be formed with the use of structured porous mask or a self-assembled monolayer (SAM) mask in conjunction with photolithography techniques described in commonly owned U.S. patent application Ser. No. 13/756, 348, entitled "CYLINDRICAL PATTERNED COMPONENT AND METHOD OF FABRICATION" filed Jan. 31, 2013, and incorporated herein in its entirety by reference.

The sacrificial casting component 230 should be able to be removed after the cylindrical rolling mask 13 has been cured without damaging the nanopattern 14. According to aspects of the present disclosure, the sacrificial casting component 230 may be a thin walled cylinder that is formed from a material that is easily fractured. By way of example, and not by way of limitation, the material may be glass, sugar, or an aromatic hydrocarbon resin, such as Piccotex™ or an aromatic styrene hydrocarbon resin, such as Piccolastic™. Piccotex™ and Piccolastic™ are trademarks of Eastman Chemical Company of Kingsport, Tenn. By way of example, and not by way of limitation, the sacrificial casting component 230 may be approximately 1 to 10 mm thick, or in any thickness range encompassed therein, e.g., 2 to 4 mm thick. The nanopattern 14 of the cylindrical mask 13 is not located on the surface of the sacrificial casting component 230, and therefore the nanopattern 14 is not susceptible to damage during the removal. According to additional aspects of the present disclosure, the sacrificial casting component 230 may be made from a material that is dissolved by a solvent that does not harm the patterend component 220 or the cylindrical mask 13. By way of example, a suitable dissolvable material may be a sugar based material and the solvent may be water. Dissolving the sacrificial casting component 230 instead of fracturing may provide additional protection to the nanopattern 14.

According to yet additional aspects of the present disclosure, the casting component 230 may be a thin walled sealed cylinder made from malleable material such as plastic or aluminum. Instead of fracturing the sacrificial casting component 230, the sealed component may be removed by collapsing the component by evacuating the air from inside the cylinder. According to yet another aspect of the present disclosure, the sacrificial casting component 230 may be a pneumatic cylinder made of an elastic material. Examples of elastic materials that may be suitable for a pneumatic cylinder include, but are not limited to plastic, polyethylene, polytetrafluoroethylene (PTFE), which is sold under the name Teflon®, which is a registered trademark of E. I. du Pont de Nemours and Company of Wilmington, Del. During the molding process, the sacrificial casting component 230 may be inflated to form a cylinder and once the cylindrical mask 13 has cured, the casting component 230 may be deflated in order to be removed without damaging the cylindrical mask. In some implementations, such a pneumatic cylinder may be reusable or disposable depending, e.g., on whether it is relatively inexpensive to make and easy to clean.

Aspects of the present disclosure describe a process 300 that may use cylindrical master mold assemblies 200 to form cylindrical masks 13. First, at 360 a sacrificial casting component 230 may be co-axially inserted into a cylindrical patterned component 220. Then, the space 240 between the sacrificial casting component 230 and the cylindrical patterned component 220 is filled with a liquid precursor that, when cured, forms an elastomeric material at 361. By way of example, and not by way of limitation, the material may be polydimethylsiloxane (PDMS).

Next, at 362 the liquid precursor is cured to form the elastomeric material that will serve as the cylindrical mask 13. By way of example, the curing process may require exposure to optical radiation. The radiation source may be located co-axially within the master mold assembly 200 when the sacrificial casting component 230 is transparent to the wavelengths of radiation required to cure the liquid precursor. Alternatively, the radiation source may be located outside of the master mold assembly 200 and the exposure may be made through the cylindrical patterned component 220. Once the cylindrical mask 13 has cured, the sacrificial casting component 230 may be removed at 362. By way of example, and not by way of limitation, the casting component 230 may be removed by fracturing, dissolving, deflating, or collapsing.

Figure 4A:
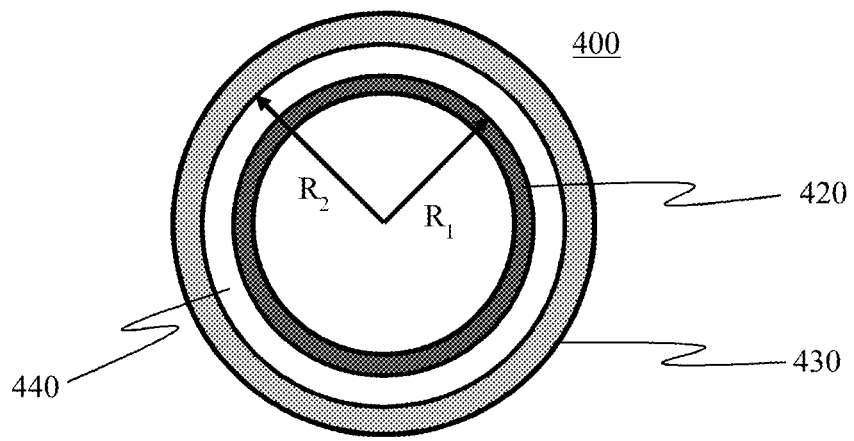
FIG. 4A is an overhead view of a cylindrical master mold assembly comprising a sacrificial casting component with a cylindrical patterned component co-axially inserted inside according to an aspect of the present disclosure.

FIG. 4A is an overhead view of a cylindrical master mold assembly 400 according to an additional aspect of the present disclosure. As shown, the cylindrical patterned component 420 may have a first radius $R_1$ and the sacrificial casting component 430 may have a second radius $R_2$ that is larger than $R_1$. The cylindrical master mold assembly 400 is formed by co-axially inserting the cylindrical patterned component 420 inside of the sacrificial casting component 430 leaving an empty space 440 between the two components.

Figure 4B:
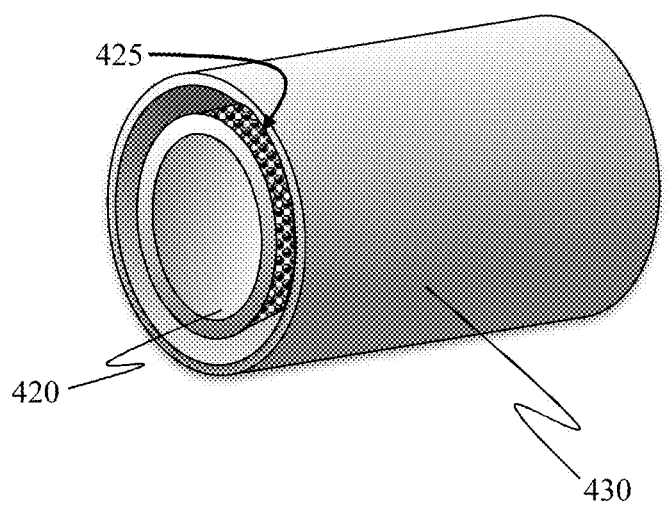
FIG. 4B is a perspective view of the cylindrical master mold assembly shown in FIG. 4A.

The patterned component 420 may be made from a material that is transparent to optical radiation, such as infrared, visible and/or ultraviolet wavelengths. By way of example, and not by way of limitation, the cylinder may be a glass, such as quartz. As shown in the perspective view in FIG. 4B, a pattern 425 is formed on the exterior surface of the cylindrical patterned component 420. By way of example, and not by way of limitation, the pattern 425 may be formed through the use of nano lithography techniques such as, but not limited to e-beam direct writing, Deep UV lithography, nanosphere lithography, nanoimprint lithography, near-field phase shift lithography, and plasmonic lithography.

The sacrificial casting component 430 may be removed after the cylindrical rolling mask 13 has been cured without damaging the nanopattern 14. According to aspects of the present disclosure, the sacrificial casting component 430 may be a thin walled cylinder that is formed from a material that is easily fractured. By way of example, and not by way of limitation, the material may be glass. The nanopattern 14 of the cylindrical mask 13 is not located on the surface of the sacrificial casting component 430, and therefore the nanopattern 14 is not susceptible to damage during the removal. According to additional aspects of the present disclosure, the sacrificial casting component 430 may be made from a material that is dissolved by a solvent that does not harm the patterend component 420 or the cylindrical mask 13. By way of example, a suitable dissolvable material may be a sugar based material and the solvent may be water. Dissolving the sacrificial casting component 430 instead of fracturing may provide additional protection to the nanopattern 14.

Figure 4C:
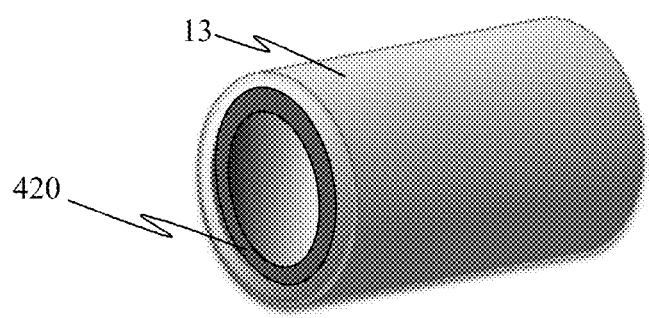
FIGS. 4C-4E depict how the cylindrical mask may be removed from the cylindrical patterned component according to aspects of the present disclosure.
Figure 4D:
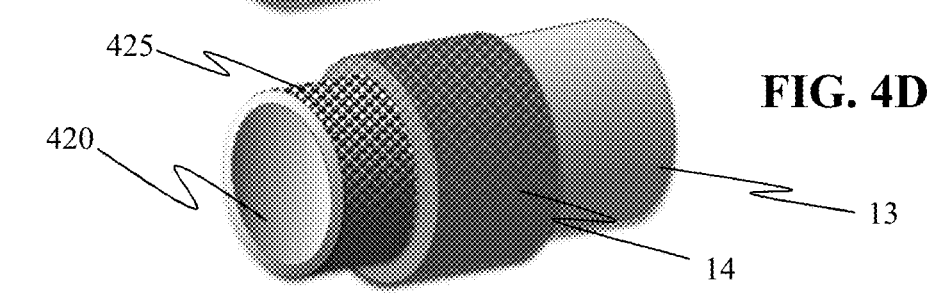
Figure 4E:
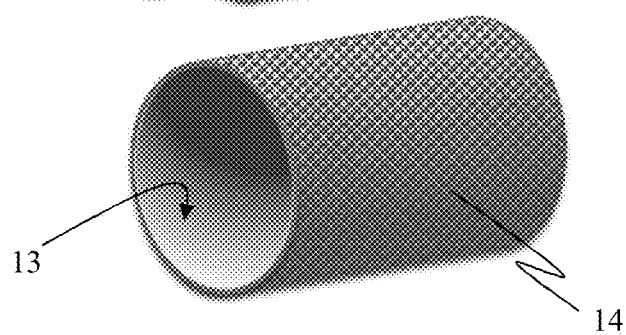
Figure 5:
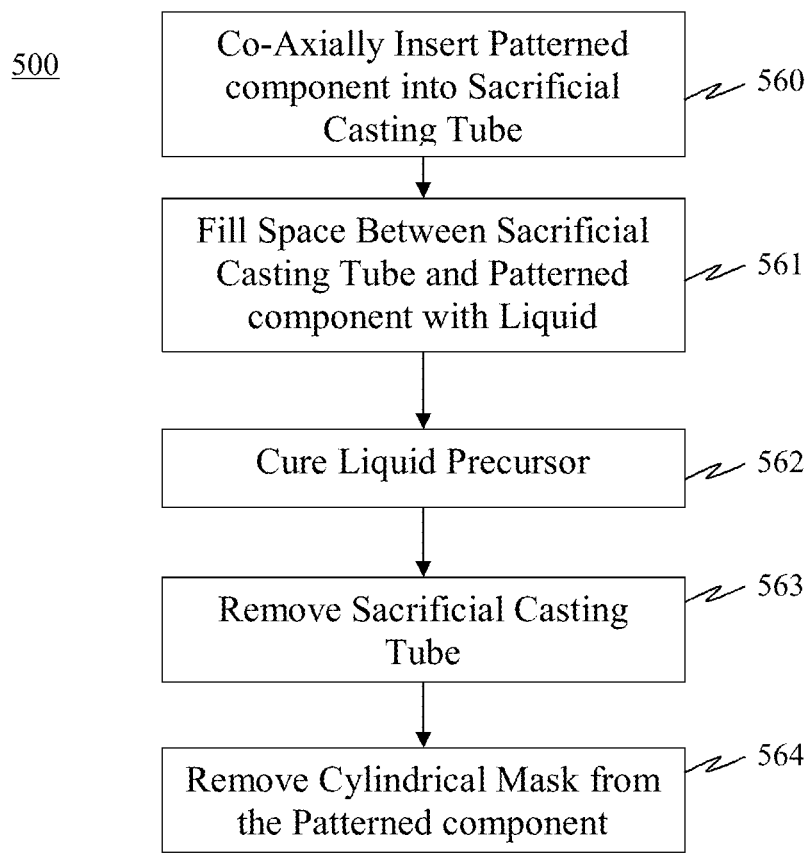
FIG. 5 is a block diagram of instructions that describe a method for forming a cylindrical mask with cylindrical master mold assembly according to aspects of the present disclosure.

After the sacrificial casting component 430 has been removed, the cylindrical mask 13 remains on the patterned component 420 as shown in FIG. 4C. In order to remove the cylindrical mask 13 from the patterned component 420 the cylindrical mask 13 may be peeled back against itself. Starting from one end of the patterned component 420, the cylindrical mask is pulled back over itself in a direction parallel to the axis of the patterned component 420, such that the interior surface where the nanopattern 14 was formed is revealed. FIG. 4D depicts the removal process at a point where the cylindrical mask 13 has been partially removed. In order to fold back on itself during the removal process, the cylindrical mask 13 should be relatively thin, e.g., 4 millimeters thick or thinner. As such, the difference between the first and second radii should preferably be 4 millimeters or less. Once the entire cylindrical mask 13 has been removed from the patterned component 420, it will have been turned completely inside out, revealing the nanopattern 14 on the exterior surface as shown in FIG. 4E.

Aspects of the present disclosure describe a process 500 that may use cylindrical master mold assemblies 400 to form cylindrical masks 13. First, at 560 a cylindrical patterned component 420 is co-axially inserted into a sacrificial casting component 430. Then, the space 440 between the sacrificial casting component 430 and the cylindrical patterned component 420 is filled with a liquid precursor that, when cured, forms an elastomeric material at 561. By way of example, and not by way of limitation, the material may be polydimethylsiloxane (PDMS).

Next, at 562 the liquid precursor is cured to form the elastomeric material that will serve as the cylindrical mask 13. By way of example, the curing process may require exposure to optical radiation. The radiation source may be located co-axially within the master mold assembly 400. Alternatively, the radiation source may be located outside of the master mold assembly 400 and the exposure may be made through the sacrificial casting component 430 if the casting component 430 is transparent to the wavelengths of radiation required to cure the liquid precursor. Once the cylindrical mask 13 has cured, the sacrificial casting component 230 may be removed at 563. By way of example, and not by way of limitation, the sacrificial casting component 230 may be removed by fracturing and/or dissolving. Finally, at 564 the cylindrical mask is pulled back over itself in a direction parallel to the axis of the patterned component 420, such that the interior surface where the nanopattern 14 was formed is revealed.

Figure 6A:
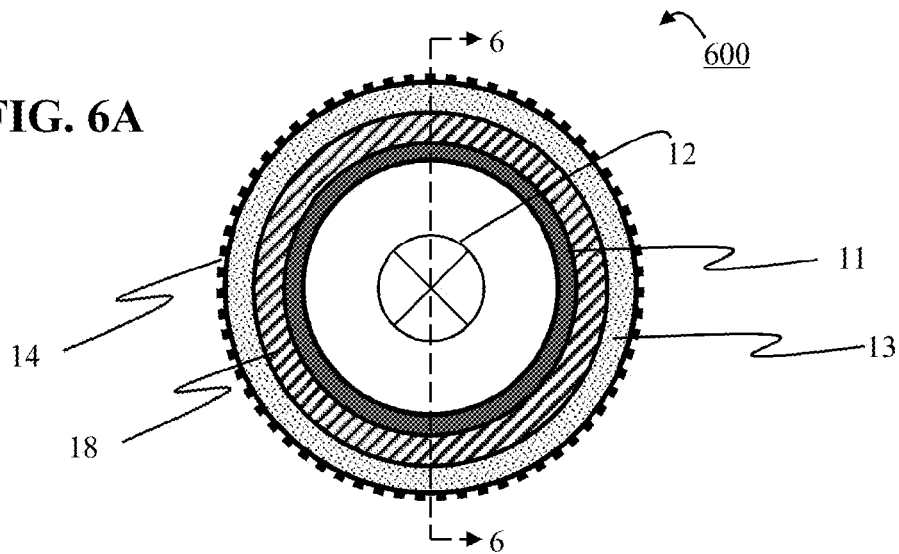
FIGS. 6A-6C depict cylindrical masks where a gas retainer is formed between the elastomeric cylinder and the rigid transparent cylinder according to aspects of the present disclosure.

FIG. 6A depicts a cylindrical mask 600 according to an additional aspect of the present disclosure. Cylindrical mask 600 is substantially similar to the cylindrical mask depicted in FIG. 1, with the addition of a gas retainer 18 located between the elastomeric rolling mask 13 and the rigid hollow cylinder 11. By way of example, and not by way of limitation, the elastomeric rolling mask 13 may have a patterend surface 14 and may be a made in substantially the same manner as described in processes 300 or 500. The rigid hollow cylinder may also be transparent to optical radiation. By way of example, and not by way of limitation, the hollow cylinder may be a glass such as fused silica. A light source 12 may be placed inside hollow cylinder 11. The gas retainer 18 retains a volume of gas 17 between the outer surface of the cylinder 11 and the inner surface of the elastomeric mask 13. The gas retainer 18 may be pressurized in order to provide an additional tunable source of compliance for the elastomeric rolling mask 13. By way of example, and not by way of limitation, the gas retainer 18 may be formed by a pair of seals or by an inflatable bladder.

Figure 6B:
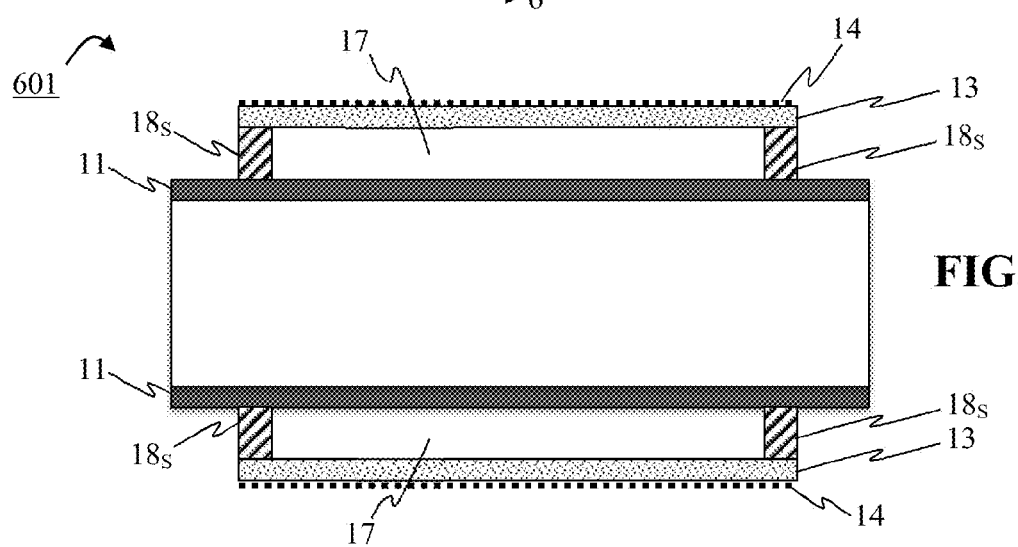

FIG. 6B is a cross sectional view along the line 6-6 shown in FIG. 6A of a cylindrical rolling mask 601 that depicts an aspect of the present disclosure where the gas retainer 18 is formed by pair of seals $18_S$. Each seal $18_S$ may be a hollow cylinder, ring, or torus-like shape, such as, but not limited to an O-ring or gasket. The seals $18s$ may be made of a suitable elastomer material. The elastomeric mask 13 may then be spaced apart from the rigid hollow cylinder 11 at each end by a seal $18_S$. The inner radius of the elastomeric mask 13 can be chosen such that the volume of gas 17 bounded by the interior surface of the elastomeric mask 13, the seals $18_S$ and the rigid outer surface of the rigid hollow cylinder 11 may be pressurized. When the volume of gas 17 is pressurized, the elastomeric mask 13 may be spaced away from the outer surface of the rigid hollow cylinder 11 by the pressure of the volume of gas 17 retained between the inner surface of the elastomeric mask 13 and the outer surface of the cylinder 11. The cylinder 11 may optionally include grooves sized and shaped to receive the seals $18s$ and facilitate retaining the seals when the gas in the volume is pressurized.

Figure 6C:

FIG. 6C is a cross sectional view along the line 6-6 shown in FIG. 6A of a cylindrical rolling mask 602 that depicts an aspect of the present disclosure where the gas retainer 18 is formed by a bladder $18_B$. The bladder $18_B$ may be cylindrical in shape and positioned between the rigid hollow cylinder 11 and the elastomeric mask 13. When volume of gas 17 within the bladder $18_B$ is pressurized, the bladder $18_B$ supports the elastomeric mask 13 above the outer surface of the rigid hollow cylinder 11.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A method for forming a cylindrical mask configured to have one or more features formed on a surface with a cylindrical master mold assembly, wherein the master mold assembly comprises a cylindrical patterned component having a first radius and a sacrificial casting component having a second radius, wherein the second radius is smaller than the first radius, wherein a surface of the patterned component facing the sacrificial casting component has one or more patterned features, the method comprising:
   a) co-axially inserting the sacrificial casting component into the cylindrical patterned component;
   b) filling a space between the cylindrical patterned component and the sacrificial casting component with a liquid precursor;
   c) curing the liquid precursor to form the elastomeric material; and
   d) removing the sacrificial casting component; and
   e) pulling the elastomeric material back over itself in a direction parallel to the axis of the patterned component, such that the elastomeric material is removed from the patterned component and is turned inside out.

2. The method of claim 1, wherein removing the sacrificial casting component comprises fracturing the sacrificial casting component.

3. The method of claim 1, wherein removing the sacrificial casting component comprises dissolving the sacrificial casting component with a solvent.

4. The method of claim 3, wherein the sacrificial casting component is made from a sugar based material, and wherein the solvent is water.

5. The method of claim 1, wherein removing the sacrificial casting component comprises, plastically deforming the sacrificial casting component.

6. The method of claim 1, wherein the sacrificial casting component is a sealed cylinder, and wherein removing the sacrificial casting component comprises deflating the sacrificial casting component.

7. The method of claim 1, wherein the difference between the second radius and the first radius no more than 2 millimeters.

* * * * *